(12) United States Patent
Lohberg et al.

(10) Patent No.: US 6,400,044 B1
(45) Date of Patent: Jun. 4, 2002

(54) PROTECTIVE ARRANGEMENT FOR ELECTRONIC FUNCTIONAL UNITS AND/OR FUNCTIONAL GROUPS

(75) Inventors: Peter Lohberg, Friedrichsdorf; Roland Burghardt, Frankfurt; Klaus Rink, Rodenbach, all of (DE)

(73) Assignee: Continental Teves AG & Co., OHG, Frankfurt (DE)

( * ) Notice: Subject to any disclaimer, the term of this patent is extended or adjusted under 35 U.S.C. 154(b) by 0 days.

(21) Appl. No.: 09/600,716

(22) PCT Filed: Nov. 23, 1999

(86) PCT No.: PCT/EP99/09001
§ 371 (c)(1),
(2), (4) Date: Sep. 8, 2000

(87) PCT Pub. No.: WO00/32022
PCT Pub. Date: Jun. 2, 2000

(30) Foreign Application Priority Data

Nov. 24, 1998 (DE) .......................................... 198 54 102
May 12, 1999 (DE) .......................................... 199 21 692

(51) Int. Cl.[7] .............................................. H05K 9/00
(52) U.S. Cl. .................. 307/91; 307/89; 307/10.1; 174/35 R; 439/607; 455/296; 455/300
(58) Field of Search .................... 307/10.1, 91, 89; 174/35 R, 52.4; 439/607; 455/300, 296; 324/96; 342/1, 4

(56) References Cited

U.S. PATENT DOCUMENTS

| | | | |
|---|---|---|---|
| 4,473,755 A | | 9/1984 | Imai et al. |
| 4,779,532 A | * | 10/1988 | Riley et al. ............... 102/202.2 |
| 4,890,199 A | | 12/1989 | Beutler |
| 5,441,301 A | * | 8/1995 | Breed et al. ................. 280/735 |
| 5,467,720 A | * | 11/1995 | Korenaga et al. ............. 108/20 |
| 5,496,966 A | * | 3/1996 | Hightower et al. .... 174/35 MS |
| 5,672,844 A | | 9/1997 | Persson et al. |
| 5,684,340 A | * | 11/1997 | Soler et al. ................... 307/91 |
| 5,737,194 A | * | 4/1998 | Hopkins et al. ............ 361/800 |

FOREIGN PATENT DOCUMENTS

| | | |
|---|---|---|
| DE | 32 44 685 | 5/1984 |
| DE | 33 23 624 | 1/1985 |
| DE | 44 42 478 | 6/1995 |
| DE | 196 36 496 | 3/1998 |
| EP | 0 481 806 | 4/1992 |
| WO | 98 12904 | 3/1998 |

* cited by examiner

Primary Examiner—Josie Ballato
Assistant Examiner—Robert L Deberadinis
(74) Attorney, Agent, or Firm—Rader, Fishman & Grauer PLLC

(57) ABSTRACT

The invention relates to an arrangement for the protection of electronic functional units and/or functional groups from disturbance quantities. The invention is characterized in that a division of the functional units and/or groups into partial units and/or groups with different sensitivity to the disturbance quantities is provided, in that a different screening from the disturbance quantities is assigned to the partial units and/or groups with different sensitivity to the disturbance quantities, and in that at least two of the screenings complete each other to a screening with a greater efficiency degree or factor, respectively.

13 Claims, 2 Drawing Sheets

PROTECTIVE ARRANGEMENT FOR ELECTRONIC FUNCTIONAL UNITS AND/OR FUNCTIONAL GROUPS

The invention relates to an arrangement for the protection of electronic functional units and/or functional groups, such as circuitries, circuit components, consumers, sensors, and the like, from disturbance variables like electromagnetic radiation, capacitive coupling, vibrations, and the like. In such electronic functional units and/or functional groups of automotive control systems, such as anti-lock brake systems (ABS), traction control systems (TCS), and particularly systems for driving stability control (ESP), the detected measuring quantities must be recorded and evaluated disturbance-free, for the measuring quantities recorded and evaluated by the functional units and/or functional groups influence or initiate safety-relevant brake events which automatically change the driving behavior of an automotive vehicle. It is a known fact that electronic functional units and/or groups used in automotive control systems include measurement recorders with highly sensitive low-frequency input stages as well as digital evaluation circuitries which are operated at a given, stable cycle of high frequency. Here, as known, disturbance signals appear at the basic frequency of the working cycle which, though narrow-banded, however can assume high amplitudes. Further on, disturbance coupling can occur due to the shift of potential of a circuitry-internal shared reference conductor to ground (ground loops) and also influences on the electromagnetic tolerance of the sensitive electronic functional units and/or groups caused by mobile phones and/or other emitters if these are active with a high output power in immediate vicinity of the functional units and/or groups. Beside these electric disturbance quantities, mechanical disturbance quantities, such as vibrations, temperature influences, torsions, and the like, influence the functional units and/or groups.

The invention is therefore based on the objective to create an arrangement for disturbance-free recording, evaluation, and transmission of safety-relevant measuring quantities.

This objective is achieved, according to the invention, by means of the features of claim 1.

The invention is based on the basic idea of a division of the functional units and/or groups into partial units and/or groups with different sensitivity regarding the disturbance quantities and of an assignment of different screenings according to the sensitivity of the partial units and/or groups, wherein at least two of the screenings complete each other to a screening with a higher efficiency degree or factor, respectively. By means of the division of the functional units and/or groups into partial units and/or groups with different sensitivity regarding the disturbance quantities, it is advantageously possible to design the screening from mechanical and electric disturbance quantities in dependence on the sensitivity of the partial units and/or groups. Here, it is provided that the screening assigned to the partial units and/or groups is identical in structure so that the screenings complete each other additively in their effect to a higher efficiency degree or factor. The invention is based on the insight that, through a stepped screening having an inner area with a high screening level and an outer area with a lower screening level and being built of a gradation of screening through always identical screening of screened areas, under assignment of the partial units and/or groups and/or of the functional units and/or groups dependent on the sensitivity regarding disturbance quantities, safety-relevant measuring quantities can be recorded, evaluated, and transmitted disturbance-free.

All partial units and/or groups with different sensitivities are arranged in separate housings, respectively. By means of the arrangement in separate housings, on the one hand, a mechanical protection of the partial units and/or groups is obtained, and on the other hand, each housing can be provided with an identical or different screening. Further on, partial units and/or groups arranged in separate housings can easily be assembled and manufactured.

Advantageously, the partial units and/or groups are connected by lines guided through the housing and connected capacitively to the housing via capacitors. The separate housings screened in this manner short-circuit high-frequency disturbance pulses with the ground, so that disturbance couplings and influences on electromagnetic tolerance are prevented. There is no galvanic contact between the housings and the environment of the circuitry.

Due to the fact that a first housing accommodating the most sensitive partial unit and/or group is surrounded by at least one further housing in which another partial unit and/or group with a lesser sensitivity is arranged, the screenings of the individual separate housings complete each other additively to a higher total efficiency degree of factor, respectively, where the screening by the outermost end housing provides the least, and the screening by the innermost housing, which is surrounded by all other screened housings, provides the highest efficiency degree. The arrangement thus consists of several electronic partial units and/or groups which are separated by cascade-like enclosing housings. Here, the inner housing, encased by the outer one, contains electronic partial units and/or groups that react more sensitively to electromagnetic radiation or capacitive couplings, respectively, than the partial units and/or groups that are arranged within the space of the encasing housing.

According to an advantageous further embodiment, on an end housing surrounding all other housings, a plug-in element is provided to which all lines of the partial units and/or groups arranged at the end housing are connected. In the end housing, beside the plug-in element (connection plug), also elements are integrated for mechanically fastening the complete functional unit and/or group to a consumer, e.g. for mechanically fastening to the vehicle chassis of an automotive vehicle.

Due to the fact that the lines guided to the plug-in element are each connected, via a capacitor, with a connection element which via a capacitor is connected to the end housing, there is no galvanic contact between this housing and the electric environment of the circuitry. A simple module is attained.

Preferably, the electronic functional units and/or functional groups are designed as a closed arrangement where multiple measuring quantities are recorded at a shared measuring location, are locally digitized and, if applicable, pre-processed regarding the signal, and then, via an appropriate interface, in particular a bus, are transmitted to connected participants of this interface, e.g. a control unit for ESP (ESP—Electronic Stability Program). To this end, a yaw rate sensor with a high sensitivity to disturbance quantities is arranged in the first housing as a partial unit and/or group. In general, such yaw rate sensors possess a movable mechanical structure which comprises an electrical-mechanical converter excited with a periodical oscillation. If this sensor encounters a turn around an axis perpendicular to the excited oscillation, the movement of the oscillation results in a Coriolis force which is proportional to the measuring quantity, i.e. the angular velocity. Through the Coriolis force, a second oscillation, perpendicular to the excited oscillation is excited in a mechanical-to-electrical converter. This second oscillation can be recorded by means of different measuring methods, where the recorded quantity serves as a measure for the rate of rotation acting on the yaw rate sensor.

According to a preferred embodiment, the partial unit and/or group arranged in a second housing surrounding the first housing is a lateral and/or longitudinal accelerometer and signal processing steps for the lateral and/or longitudinal accelerometer and for the yaw rate sensor. This partial unit and/or group has a lesser sensitivity to the previously mentioned disturbance quantities, for their signal amplitudes are greater.

In a further advantageous embodiment of the invention, the partial unit and/or group arranged in a third housing surrounding the first and the second housing is a network, in particular a signal processor, and a bus controller. The network, that digitally processes the signals coming from the sensors and signal processing steps and formats them for a bus connection CAN (Controller Area Network), is arranged on a circuit board (assembly unit).

Basically, the invention pursues the principle that always one partial unit of a functional unit and/or group screened by a housing is, together with a partial unit not screened by this housing, surrounded by a housing covering both partial units, and this screening principle is continued in a cascade-like manner until a demanded total screening effect is achieved.

Preferably, there is galvanic connection of the housings to the partial units of a functional unit and/or group, but always a capacitive connection between every housing and the electric lines into this housing. Only the connections C3 and C7 can be designed as an exception of the strict galvanic separation, which, according to an embodiment, build, as a bridge, i.e. without a capacitor, a direct connection between the respective housing and ground. By means of this design, the screening can be enhanced in certain cases as empirical studies showed.

The housings are connected with each other via vibration-damping coupling elements which likewise complete each other in their total effect to a total damping with a higher degree of efficiency than each individual damping of every separate housing.

The preferably metallic or electrically conducting housings, respectively, are screwed in a galvanically conducting way onto the vehicle chassis, where, due to the cascade-like screening, no impermissible electric or high-frequency disturbance influences appear within the screened housings which can falsify the safety-relevant measuring quantities. The direct metallic contact allows as well for a good thermal abduction of the housings among each other and thus of the end housing to the vehicle chassis. At the same time, the metallic housing provides for a sufficient torsion stiffness which is necessary in order to measure the yaw rate and the lateral and/or longitudinal acceleration with sufficient precision. Due to the vibration-damping measure, a falsification of the output signal of the yaw rate sensor caused by internal acoustical resonance phenomena or by body sound influences via the vehicle chassis is prevented.

An embodiment of the invention is depicted in the drawing and is subsequently described more closely.

Figure 1:
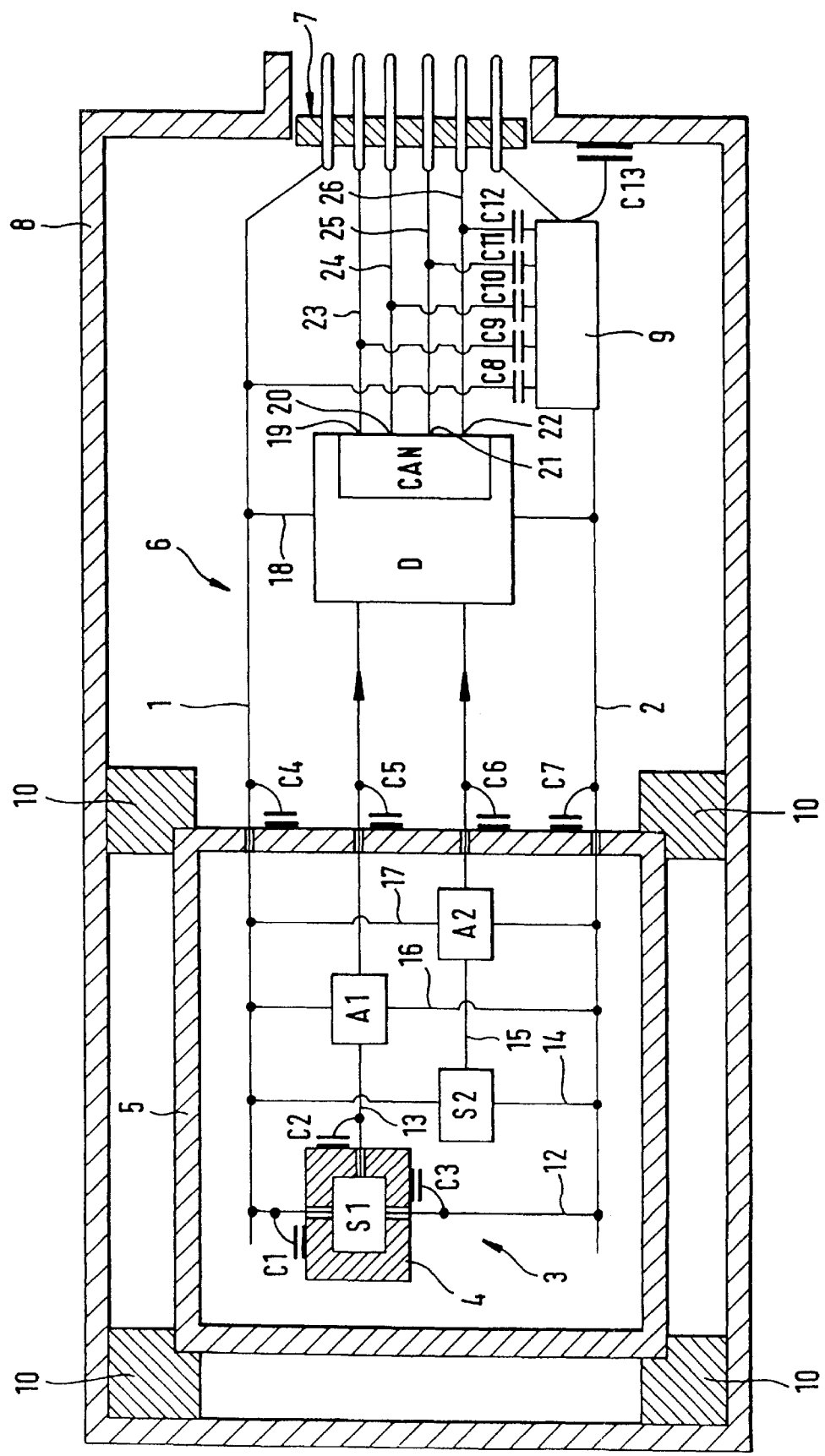
FIG. 1 shows a schematic depiction of the circuitry with the screened housings.

FIG. 1 serves for the explanation of the principal arrangement according to the invention. Only the essential components or partial units and/or groups of the functional units and/or groups of the circuitry are symbolically depicted. The invention is described using the example of a sensor system for driving stability control (ESP). The arrangement for influencing the driving behavior of an automotive vehicle provides a sensor S1 which consists of an electrical-to-mechanical converter, preferably with an assigned excitation amplifier, and an mechanical-to-electrical converter with an assigned signal reception amplifier. The yaw rate sensor S1 with the signal reception amplifier and the excitation amplifier is surrounded by a housing 4 and connected in parallel to the supply lines 1 and 2 via line 12. Line 13 connects the yaw rate sensor S1 with a signal processing step A1 optionally provided outside of the housing 4. Sensor S1, which preferably is a quartz tuning fork for yaw rate detection with integrated signal reception amplifier and excitation amplifier, is at the same time the most disturbance-sensitive functional unit, for the electrical-to-mechanical converter depends on the mechanical oscillation amplitude of the tuning fork. The mechanical-to-electrical converter connected with the electrical-to-mechanical converter supplies a signal at the same oscillation frequency as the excited electrical-to-mechanical converter, however, its amplitude is proportionally dependent on the rate of rotation. The converter bodies employed in yaw rate sensors generate an electrical charge as a signal for the deviation whose sensitivity to disturbance quantities is great, for it possesses very small amplitudes.

The housing 4, which surrounds the partial unit S1 set up this way, is designed galvanically conducting and capacitively connected via C1, C2, C3 with the lines 12 and 13 of S1. According to an embodiment variant, the connection C3 is connected to line 12 in a galvanically conducting way as a bridge—without capacitor. The screened housing 4 is surrounded by another housing 5 in which there is arranged another partial unit, for instance a lateral accelerometer and/or a longitudinal accelerometer S2 which consists of a silicon element for detection of a lateral acceleration. The lateral accelerometer S2 is connected via line 14 to the supply lines 1 and 2. Via line 15, the lateral accelerometer S2 is connected optionally to a signal processing step A2 so that in housing 5, the lateral accelerometer S2, the signal processing step A2, and the Signal processing step A1 are arranged. The signal processing steps A1 and A2 are connected via the lines 16 and 17 to the supply lines 1 and 2. The lines 1, 13, 15, and 2 exit the galvanically conducting housing 5. Again, there is no galvanic contact between this functional unit, S2, A1, and A2, and the housing. The supply lines 1, 13, 15, and 2 are capacitively connected to the housing 5 through capacitors C4, C5, C6, and C7. According to an embodiment variant, the connection C7 is connected as a bridge B7 to line 2 in a galvanically conducting way. The partial units S1, S2, A1, A2 are mechanically mounted on a circuit board (assembly unit).

The galvanically conducting housings is surrounded by a further end housing 8 which comprises a network D which, on its input side, is connected to the lines 13, 15 guided out of the housing 5. The network D consists, for example, of an analog-to-digital converter and a digital-to-analog converter. As well as a controller which digitally processes and formats the signals coming from Assembly unit 3 for a bus interface. The network with the bus interface CAN is connected via line 18 to the supply lines 1 and 2.

According to an advantageous embodiment, the signal processing steps A1 and A2 are omitted so that their function is performed digitally in the network D. Here, the network D, which is designed as a digital signal processor, takes on processing the signals of sensors S1 and S2, as well as the excitation of the electrical-to-mechanical converter of the yaw rate sensor S1.

The end housing 8 comprises a plug-in element 7 to which the signal outputs 19, 20, 21, 22 of the assembly unit 6 are led. The signal outputs 19 to 22 through lines 23 to 26, which are connected to the respective plug-in pins, as well as line 1, each via a capacitor C8, C9, C10, C11, C12, are connected to a connection element 9. Connection element 9 is connected to the outer housing 8 via the capacitor 13 and to the supply line 2. There is no galvanic contact between this housing and the partial unit D, CAN.

The arrangement pursues the principle that a partial unit of a functional unit, screened by a housing.4,5, together with a partial unit not screened by this housing 4,5, is surrounded by a housing covering both partial units, e.g. S1 surrounded by screened housing 4 and screened housing 5 and screened housing 8, or partial unit S2, A1, A2, surrounded by screened housing 5 and screened housing 8, wherein this covering system is continued in a cascade-like or stepwise manner until a demanded total screening of the partial units possessing different sensitivities to disturbance quantities is attained. Here, no galvanic connection of the housings exists to the electric partial units, but always a capacitive connection between the housings 4, 5, 8 and the electric supplies 1, 2, 13, 15, 23, 24, 25, 26 into these housings 4, 5, and 8. The housings 4, 5, and 8 are interconnected via a vibration-eliminating coupling elements whose effect cascades as well. The housing 4 is connected with the housing 5 in a vibration-damping way (not depicted in closer detail), and the housing 5 is connected in a vibration-damping way to housing 8 through vibration-damping coupling elements 10.

The metallic end housing 8 is, preferably in a galvanically conducting way, screwed onto a vehicle chassis of an automotive vehicle, where, due to the cascade-like screening, no inadmissible electric or high-frequency disturbance influences occur, for it is achieved through the screening. The safety-technological measuring quantities, as required for driving stabilization of a vehicle, cannot be falsified so that erroneous excitations or errors in the control program can be excluded with certainty.

The direct metallic contact makes possible at the same time a good heat abduction from the end housing 8 to the vehicle chassis. At the same time, the metallic end housing 8, in connection with the structure through housings 5 and 4 described above, provides for sufficient mechanical torsion stiffness which is necessary in order to measure a yaw rate and a lateral acceleration with sufficient precision. By means of the vibration-damping measures, it is prevented that housing-internal acoustical resonance oscillations and body sound influences falsify, via the vehicle chassis, the output signal of the sensor S1, in particular of the mechanical-to-electrical converter.

Figure 2:
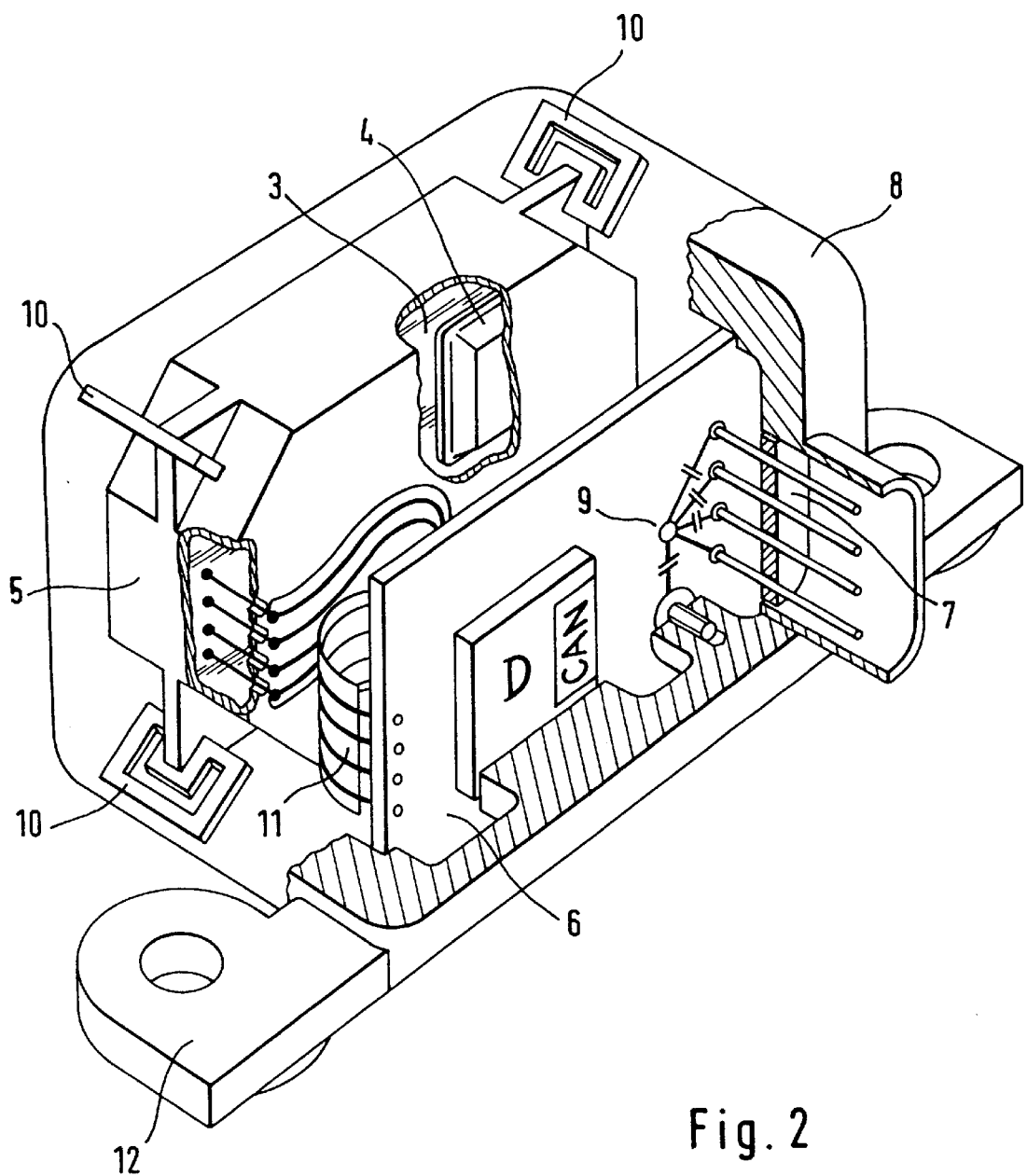
FIG. 2 shows an embodiment according to FIG. 1.

FIG. 2 shows an embodiment according to the invention, where the same reference numerals are used for identical modules. The allocation of the functional units and/or groups and partial units and/or groups, respectively, is evident from the reference numerals. In the practical realization, the capacitors C4, C5, C6, and C7 are formed as feed-through capacitors. The circuit boards 3 and 6 (assembly units) are connected through a flexible conductor foil. The metallic end housing 8 is directly screwed onto a vehicle chassis of an automotive vehicle or onto an metallic holder to the vehicle chassis. The arrangement is connected via the plug 7 to the wiring harness.

What is claimed is:

1. System for protection of electronic components from electromagnetic disturbance, comprising:

diving the components into groups, each group representing a different sensitivity to electromagnetic disturbance assigning a different screening enclosure to each group, wherein at least two screenings are physically arranged with respect to one another such that at least one of them screens with a greater effect.

2. System according to claim 1, wherein the screenings are physically arranged to one another via vibration-damping coupling elements.

3. System according to claim 1, wherein each group is arranged in a separate housing and said screening from said electromagnetic radiation is provided by said housings.

4. System according to claim 3, wherein the groups are connected to lines guided through the housings, which lines are connected to the housings capacitively and in a galvanically conducting way by way of a bridge.

5. System according to claim 3, further including a first housing accommodating the most sensitive group is surrounded by at least a second housing in which a further group is arranged.

6. System according to claim 3, further including an end housing surrounding all other housings, wherein a plug-in element is provided, onto which all lines arranged in the end housing are led.

7. System according to claim 6, wherein the lines supplied to the plug-in element are each connected by way of a capacitor to a connection element which, by way of a capacitor, is capacitively connected to the end housing.

8. System according to claim 6, wherein the end housing is connected to a heat-conducting portion part of an automotive vehicle by way of direct metallic contact.

9. System according to claim 6, wherein the end housing is physically arranged to the other housings via vibration-damping coupling elements.

10. System according to claim 3, wherein the group arranged in the first housing is a yaw rate sensor.

11. System according to claim 10, wherein the group arranged in the second housing is a lateral accelerometer and signal processing circuitry for the lateral accelerometer and the yaw rate sensor, wherein said second housing surrounds said first housing.

12. System according to claim 11, wherein the group arranged in a third housing is a network including a signal processor, and a bus interface wherein said third housing surrounds said first and second housing.

13. System according to claim 3, wherein the housings are interconnected by way of vibration-damping coupling elements.

* * * * *